(12) United States Patent
Gil et al.

(10) Patent No.: US 7,696,533 B2
(45) Date of Patent: Apr. 13, 2010

(54) INDIUM NITRIDE LAYER PRODUCTION

(75) Inventors: Bernard Gil, Montpellier (FR); Olivier Gérard Serge Briot, Jacou (FR); Sandra Ruffenach, Montarnaud (FR); Bénédicte Maleyre, Montpellier (FR); Thierry Joseph Roland Cloitre, Montpellier (FR); Roger-Louis Aulombard, Juvignac (FR)

(73) Assignees: Centre National de la Recherche Scientifique (CNRS), Paris (FR); Universite Montpellier II, Montpellier (FR)

( * ) Notice: Subject to any disclaimer, the term of this patent is extended or adjusted under 35 U.S.C. 154(b) by 0 days.

(21) Appl. No.: 11/662,491

(22) PCT Filed: Sep. 14, 2005

(86) PCT No.: PCT/FR2005/002275

§ 371 (c)(1),
(2), (4) Date: Jul. 10, 2007

(87) PCT Pub. No.: WO2006/032756

PCT Pub. Date: Mar. 30, 2006

(65) Prior Publication Data

US 2007/0269965 A1 Nov. 22, 2007

(30) Foreign Application Priority Data

Sep. 16, 2004 (FR) .................................. 04 09813

(51) Int. Cl.
*H01L 29/20* (2006.01)
(52) U.S. Cl. ........................... 257/183; 438/46; 438/47; 438/93; 438/94; 438/172; 257/200; 257/615; 257/E33.037

(58) Field of Classification Search ............. 438/46–47, 438/93–94, 172
See application file for complete search history.

(56) References Cited

U.S. PATENT DOCUMENTS

| 6,121,639 A | 9/2000 | Van de Walle et al. |
| 6,284,395 B1 | 9/2001 | Maruska et al. |
| 6,306,739 B1 * | 10/2001 | Alexander .................. 438/584 |

OTHER PUBLICATIONS

Higashiwaki et al., "High-Quality InN Film Grown on a Low-Temperature-Grown GaN Intermediate Layer by Plasma-Assisted Molecular-Beam Epitaxy," May 2002, Jpn. J. Appl. Phys. vol. 41, pp. L540-L542.*
Osinsky et al., "New Concepts and Preliminary Results for SiC Bipolar Transistors: ZnSiN2 and ZnGeN2 Heterojunction Emitters", 2000, IEEE pp. 168-172.*
Briot et al., "Indium nitride quantum dots grown by metalorganic vapor phase epitaxy," *Applied Physics Letters*, vol. 83, No. 14, Oct. 6, 2003.

(Continued)

*Primary Examiner*—Alexander G Ghyka
*Assistant Examiner*—Leonard Chang
(74) *Attorney, Agent, or Firm*—Foley & Lardner LLP

(57) ABSTRACT

The invention relates to a structure usable in electronic, optical or optoelectronic engineering which comprises a substantially crystalline layer made of an alloy consisting of at least one element of the column II of the periodic elements system and/or at least one element of the column IV of the periodic elements system and of $N_2$ (said alloy being noted N-IV-$N_2$), wherein said structure also comprises an InN layer. A method for producing an indium nitride layer, a substrate forming plate and the use thereof for indium nitride growth are also disclosed.

17 Claims, 2 Drawing Sheets

OTHER PUBLICATIONS

Suh et al., "Combinatorial design of semiconductor chemistry for bandgap engineering: "virtual" combinatorial experimentation," *Applied Surface Science*, vol. 223, 2004, pp. 148-158.

Lu et al., "Effect of an AlN buffer layer on the epitaxial growth of InN by molecular-beam epitaxy," *Applied Physics Letters*, vol. 79, No. 10, Sep. 3, 2001, pp. 1489-1491.

Saito et al., "Growth of High-Electron-Mobility InN by RF Molecular Beam Epitaxy," *The Japan Journal of Applied Physics*, Part 2 41, L91-L93, 1991.

Bhuiyan et al., "Indium nitride (InN): A review on growth, characterization, and properties," vol. 94, No. 5, Sep. 1, 2003, pp. 2780-2808.

* cited by examiner

INDIUM NITRIDE LAYER PRODUCTION

CROSS REFERENCE TO RELATED APPLICATIONS

This application is a National Stage application of PCT/FR2005/002275, filed Sep. 14, 2005, which claims priority from French patent application FR 0409813, filed Sep. 16, 2004.

The present invention relates to the production of indium nitride (InN).

Semiconductor nitrides (InN, GaN, AlN) have been the subject of very many studies over the last ten years. Electronic components of very high performance based on these materials have in fact been produced, fabricated on an industrial scale and commercialized.

Indium nitride InN itself has remained little known and little used, owing to the difficulty of fabricating it.

Recently, fresh efforts have been made to improve the fabrication of this material and to determine its physical properties. Fundamental characteristics, such as the bandgap, have been completely reviewed and the potential of this material for electronic components has been confirmed.

Thus, for example in optics and optoelectronics, the emission and detection spectrum of light-emitting diodes (LEDs) and laser diodes (LDs) has been able to be extended into the infrared (for telecommunications, analysis, imaging, etc.), while in electronics, transistors working at higher temperature and at higher power have been discovered, thus giving microwave devices (for communication, radars, etc.).

The current production of InN uses crystal growth techniques, such as MOVPE (Metal Organic Vapor Phase Epitaxy) and MBE (Molecular Beam Epitaxy).

One difficulty lies in the choice of crystalline support for producing such crystal growths, said support having to have physical parameters sufficiently close to the material to be deposited, especially as regards crystal structure and lattice parameters.

It is thus possible to use a GaN substrate. However, deposition of InN by MOVPE on a GaN substrate has a tendency not to form uniformly on the surface but inhomogenously, so as to cause InN to collect into islands (see for example the article by O Briot et al., in Applied Physics Letters 83, 14 (2003) 2919).

It is also possible to use a substrate consisting of sapphire ($Al_2O_3$ in hexagonal form). In this case, a more uniform deposition of InN is obtained. However, the difference in lattice parameter between the InN film and the sapphire substrate is about 25%, which is still much too large for obtaining an InN film of satisfactory crystalline quality, the presence of internal defects and stresses degrading its electronic properties.

Pseudosubstrates, namely wafers comprising a crystalline support substrate on which a buffer layer has been grown epitaxially, said layer serving as substrate for the growth of InN, have also been tested.

InN nucleation films confining the defects (such as dislocations) and having a surface of better quality for the subsequent growth of a useful InN film have thus been tested (see for example the article by Y. Saito in Japan. J. Appl. Phys., Part 2 40, L91 (1991)).

Thus, AlN nucleation films on which InN films have been grown epitaxially have been tested (see for example the article by H. Lu et al., in Appl. Phys. Letter 79, 1489 (2001)).

Thus, GaN and InN nucleation films formed at low temperature have been tested (see for example the article by M. Higashiwaki and T. Matsui in Japan. J. Appl. Phys., Part 2 41, L540 (2002)).

These techniques using pseudosubstrates or nucleation films can still be lengthy, complex and expensive to implement.

Moreover, they still have not given optimum results as regards the structure of the InN film finally obtained, defects and stresses in particular remaining therein.

A first objective of the invention is to produce an InN film of superior crystalline quality than that existing in the prior art, especially with fewer internal crystallographic defects such as dislocations.

A second objective of the invention is to find a substrate for InN crystal growth that makes it possible to obtain an InN film having a quality consistent with that sought in said first objective.

A third objective of the invention is that this substrate should contain very little or no oxygen, so as to simplify chemical etching treatments that may be carried out during the production of the substrate and/or the InN film.

SUMMARY OF THE INVENTION

The present invention aims to improve the situation by proposing, according to a first aspect, a structure for an application in electronics, optics or optoelectronics, comprising a film made of an alloy of at least one atomic element of Group II of the Periodic Table and/or at least one atomic element of Group IV of the Periodic Table and of $N_2$ (this alloy then being denoted by II-IV-$N_2$), characterized in that said structure further includes a film of InN.

DETAILED DESCRIPTION OF THE PREFERRED EMBODIMENTS

Figure 1:
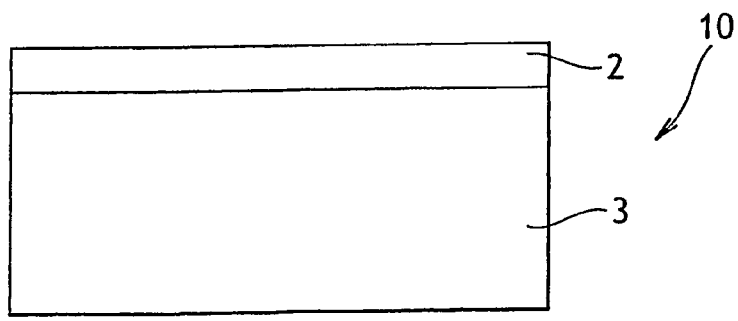
FIG. 1 shows film (2) and support structure (3).

Other possible features of this structure are:
the film of InN is on the film made of II-IV-$N_2$ alloy;
the structure further includes, beneath the II-IV-$N_2$ alloy, a support structure made of AlN, GaN, SiC or Si;
the structure further includes, beneath this support structure, a crystalline support substrate;
the film of II-IV-$N_2$ has a sufficient thickness to be a buffer layer between the support structure and the InN film, and especially by confining crystallographic defects within it;
the formula of the II-IV-$N_2$ alloy is chosen from the following possible combinations: (Mg,Ca,Zn,Cd)—(C,Si,Ge,Sn,Pb)—$N_2$; and
the II-IV-$N_2$ alloy and/or the InN alloy further includes at least one doping element.

According to a second aspect, the invention proposes a process for producing an indium nitride film, characterized in that it includes a crystal growth step in which an InN film is grown on a film made of an alloy of at least one atomic element of Group II and/or at least one atomic element of Group IV and of $N_2$ (this alloy then being denoted by II-IV-$N_2$).

Other possible features of this process are:
the growth of InN is carried out at a temperature of about 700° C. or below;
the process further includes a prior crystal growth step in which the film of II-IV-$N_2$ is grown on a support structure made of AlN, GaN, SiC or Si;
the process further includes an initial crystal growth step in which this support structure is grown on a support substrate made of a crystalline material; and
the crystal growth is chosen from the following techniques: MOVPE and MBE.

According to a third aspect, the invention proposes a wafer including an upper film made of an alloy of at least one atomic element of Group II of the Periodic Table and/or of at least one atomic element of Group IV of the Periodic Table and of $N_2$ (the alloy then being denoted by II-IV-$N_2$), characterized in that this upper film has a sufficient thickness to constitute a buffer layer.

Other possible features of this wafer are:
the formula of the II-IV-$N_2$ alloy is chosen from the following possible combinations: (Mg,Ca,Zn,Cd)—(C,Si,Ge,Sn,Pb)—$N_2$;
the thickness of the upper film is between about 0.1 microns and 5 microns;
the wafer further includes, beneath the II-IV-$N_2$ alloy, a support structure made of AlN, GaN, SiC or Si; and
the wafer further includes, beneath the support structure, a crystalline support substrate.

According to a fourth aspect, the invention proposes the use of a wafer comprising, in its upper part, an alloy of at least one atomic element of Group II of the Periodic Table and/or at least one atomic element of Group IV of the Periodic Table and of $N_2$ (the alloy then being denoted by II-IV-$N_2$) as substrate for the crystal growth of InN.

The structure according to the invention is intended for applications in optics, optoelectronics or microelectronics.

The structure according to the invention comprises an InN film and an alloy consisting of at least one element of Group II and/or of at least one element of Group IV and of $N_2$, this alloy then being denoted by II-IV-$N_2$.

Preferably, the structure according to the invention includes an InN film directly on an II-IV-$N_2$ alloy. The II-IV-$N_2$ alloy then forms a substrate or pseudosubstrate for InN growth.

The II-IV-$N_2$ alloy is chosen from the various alloys obtained by the set of the following possible combinations: (Mg,Ca,Zn,Cd)—(C,Si,Ge,Sn,Pb)—$N_2$.

Recently, a few rare teams have become interested in a new class of nitride materials formed from such ternary alloys of the II-IV-$N_2$ type. The purpose of these studies is to take advantage of the electronic and semiconductor properties of $ZnSiN_2$ and $ZnGeN_2$. The $ZnSiN_2$ and $ZnGeN_2$ materials are intended here to constitute the electronic or optoelectronic components. The reader may in particular refer to documents U.S. Pat. No. 6,284,395 and U.S. Pat. No. 6,121,639.

The invention uses these II-IV-$N_2$ materials not as active film, for its intrinsic electronic properties, but as substrate for the growth of films or structures based on indium nitride.

This is because the Applicant has determined that an InN film deposited on an II-IV-$N_2$ alloy has a crystalline quality, and physical and electronic properties, which are markedly better than those in the prior art (see especially the experimental results later).

This result may be due to the fact that the II-IV-$N_2$ materials are materials similar to InN and therefore possess similar physical properties.

The Applicant has in particular observed that the lattice parameters of the two materials are quite close: the lattice parameters of hexagonal InN are about: a=3.54 Å and c=5.71 Å (see in particular FIG. 15 of "Indium nitride (InN): a review of growth, characterization and properties" by A. G. Bhuiyan et al., Journal of Applied Physics, vol. 94, 5 (2003)). The lattice parameters of II-IV-$N_2$ alloys are quite poorly known, and are instead calculated by simulation, such as that carried out by C. Suh and K. Rajan in "Combinatorial design of semiconductor chemistry for bandgap engineering: virtual combinatorial experimentation" (Applied Surface Science 223 (2004) 148-158).

Since a key criterion in choosing a substrate is its lattice parameter, allowing a "lattice mismatch" with the epilayer to be grown (expressed as a percentage), the choice of an II-IV-$N_2$ alloy substrate therefore seems particularly judicious given the closeness of their respective lattice parameters with that of InN.

Thus, it has been found that InN has a lattice mismatch of about 9% with $ZnSiN_2$ and about 10% with $ZnGeN_2$.

These lattice mismatches are the same as or smaller than those known in the prior art.

Moreover, II-IV-$N_2$ alloys exhibit good mechanical compatibility with InN when undergoing changes in thermal conditions.

The Applicant has also found, during thermogravimetric measurements, that $ZnSiN_2$ retains its mechanical and crystallographic integrity up to 700° C. Now, since the epitaxy of InN is conventionally carried out at a temperature below about 700° C., the II-IV-$N_2$ alloys are therefore stable substrates.

Since the II-IV-$N_2$ alloys possess little or no oxygen, chemical etching treatments may be carried out (during production of the desired structure, for example within the context of a surface cleaning or smoothing operation) with substantially less fear of wear or damage of the equipment used than with equipment used on materials containing oxygen (which are harder to work).

Since the II-IV-$N_2$ materials are themselves deposited by epitaxy on another substrate, these will be referred to here as "pseudosubstrates" for the deposition of indium nitride and of materials and structures associated with indium nitride. Among these II-IV-$N_2$ alloys, $ZnSiN_2$ and $ZnGeN_2$ were studied in practice and it turns out that their lattice parameters are close to that of GaN. It was therefore envisaged to form electronic devices based on these two materials, by depositing them either on GaN or on sapphire.

Figure 2:
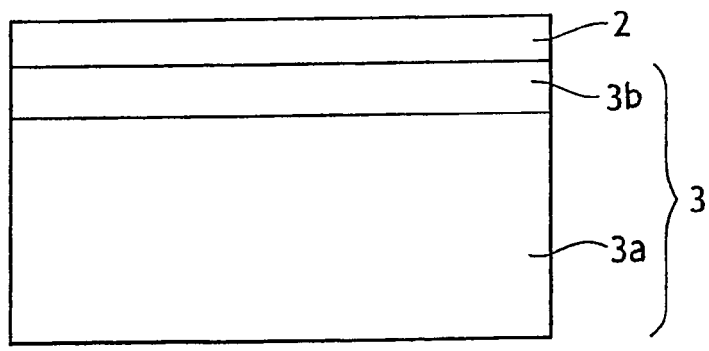
FIG. 2 shows film (2) and support structure (3) as a wafer including a support substrate 3a made of crystalline material and a support film 3b.

Referring to either FIG. 1 or FIG. 2, the II-IV-$N_2$ alloy is preferably in the form of a film 2 produced by crystal growth on a wafer 3 made of a crystalline material, thus forming a support.

Referring to FIG. 1, this wafer 3 may be a bulk wafer consisting of a material such as sapphire ($Al_2O_3$), (111)Si or SiC.

Referring to FIG. 2, this wafer 3 may be composed of a support substrate 3a made of crystalline material and of a support film 3b, it being possible for example for the support substrate to be sapphire or SiC and for the support film 3b to be of GaN, AlN, SiC or (111)Si grown epitaxially beforehand on the support substrate.

The epitaxy surface of the wafer 3 may be worked so as to improve its physical properties for the crystal growth of the II-IV-$N_2$ alloy. One or more of the following techniques may be employed: polishing, chemical etching, or other techniques known to those skilled in the art.

For example, if the wafer 3 is made of sapphire, the surface may be cleaned with etching solutions such as $3/1 H_2SO_4/H_3PO_4$ at about 80° C. and then rinsed with deionized water.

The II-IV-$N_2$ material may be deposited by many epitaxial techniques, such as MOVPE and MBE.

MOVPE is used more often for reasons of easier production on an industrial scale, and is very applicable for compounds of the (Zn,Cd)—(C,Si,Ge,Sn,Pb)—$N_2$ type.

MBE lends itself better to the production of materials containing Mg and Ca, the latter species not having precursors that are easy to use in MOVPE.

In MOVPE, the technique commonly employed is to promote chemical reactions between the precursors of the elements of the alloy (II, IV and $N_2$) on the surface of the wafer 3. The precursors of the element II conventionally employed are: dimethyl zinc (DMZn) or diethyl zinc (DEZn) in order to obtain Zn; dimethyl cadmium (DMCd) in order to obtain Cd; tetramethyl tin (TMSn) in order to obtain Sn; and tetraethyl lead and tetramethyl lead (TMPb, TEPb) in order to obtain lead. The precursors of the element IV conventionally employed are silane ($SiH_4$) and germane ($GeH_4$) in order to obtain Si and Ge respectively. The $N_2$ precursor conventionally employed is ammonia ($NH_3$) or a nitrogen source.

The growth takes place at temperatures conventionally below about 1100° C.

In particular, epitaxial growth may take place at temperatures between about 450° C. and about 800° C.

A total pressure between about 20 mbar and atmospheric pressure may be used.

The molar flow rate ratios between all of the elements II and IV and ammonia are commonly between 1500 and 50 000.

If MBE is used to grow the film 2, calcium (Ca) and magnesium (Mg) are used in the form of a solid source. The nitrogen is supplied by using a stream of ammonia or else a nitrogen plasma.

The II-IV-$N_2$ film 2 constituting the pseudosubstrate for the InN has a thickness that may be up to several microns, particularly a thickness between about 0.1 μm and about 5 μm, more particularly between about 1 μm and about 5 μm, more particularly between about 2 μm and about 5 μm and more particularly between about 3 μm and about 5 μm.

It is desirable to achieve a sufficient thickness so that the free surface of the film 2 is of satisfactory crystalline quality for subsequently producing thereon a high-quality InN film. This is because, since the interface between the II-IV-$N_2$ film 2 and the subjacent wafer 3 conventionally includes a possibly high concentration of crystal defects, the presence of which is mainly due to the lattice mismatches that may exist between the two materials in question, these defects will then gradually decrease in the thickness. The II-IV-$N_2$ film 2 therefore has the function of a buffer layer between the wafer 3 and the InN film to be formed, since it does not only match a lattice parameter with that of InN, but it also confines defects therein.

In one particular situation, specific treatments (such as particular chemical and/or heat treatments) may be employed so as to be able to confine the defects only near the interface with the wafer 3.

For example, a sapphire wafer 3 may undergo a surface nitriding operation, then a low-temperature deposition (typically at about 400° C.) of $ZnSiN_2$ with a small thickness and finally a treatment at a higher temperature (i.e. above about 400° C. and preferably between 400° C. and 700° C.) for recrystallization, before a second $ZnSiN_2$ deposition in order to produce the final film 2. The main crystal defects in the film 2 will then be confined in the first thickness deposited.

By employing the techniques according to the invention, the Applicant has succeeded in obtaining very smooth II-IV-$N_2$ alloy surfaces of high quality with an RMS roughness that may be about 20-30 Å.

Such a film 2 of II-IV-$N_2$ alloy is therefore grown epitaxially on a wafer 3 forming an initial substrate.

Figure 3:
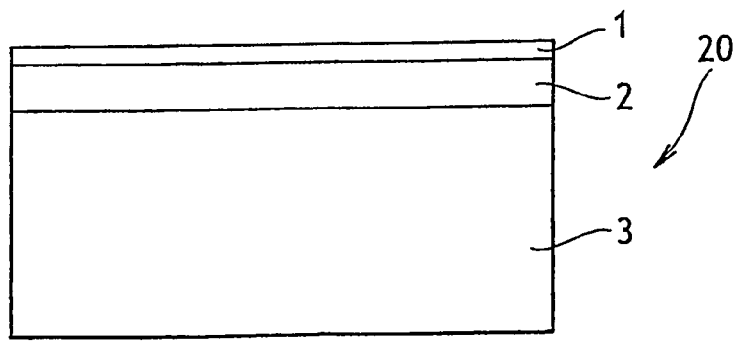
FIG. 3 shows an InN film (1) on film (2) and support structure (3).

Once the pseudosubstrate 10 has been formed by one or other of the abovementioned techniques, an InN film 1, referring to FIG. 3, is grown on the II-IV-$N_2$ alloy.

Prior to the deposition, it is possible to carry out a chemical and/or mechanical treatment, such as etching and/or polishing, suitable for cleaning and smoothing the surface sufficiently for it to be able to be ready for epitaxy by MOVPE or MBE.

MOVPE or MBE may be employed for this purpose.

In the case of InN epitaxy by MOVPE, it is possible for example to use as precursors trimethylindium (for InN) and ammonia (for nitrogen). It is preferable to carry out the reactions in an inert atmosphere, such as an $N_2$ atmosphere.

In the case of InN epitaxy by MBE, it is possible for example to use a solid source, namely bulk indium, and a gas source, such as nitrogen ($N_2$) or ammonia ($NH_3$), the molecules of which will be dissociated for example by a radio-frequency plasma.

The growth temperature may be about 700° C. or below, preferably between about 400° C. and about 650° C. Moreover, it is somewhat below that employed for fabricating the pseudosubstrate 10, so as to prevent the latter from degrading. The II-IV-$N_2$ materials are thus thermally compatible with indium nitride growth.

Figure 4:
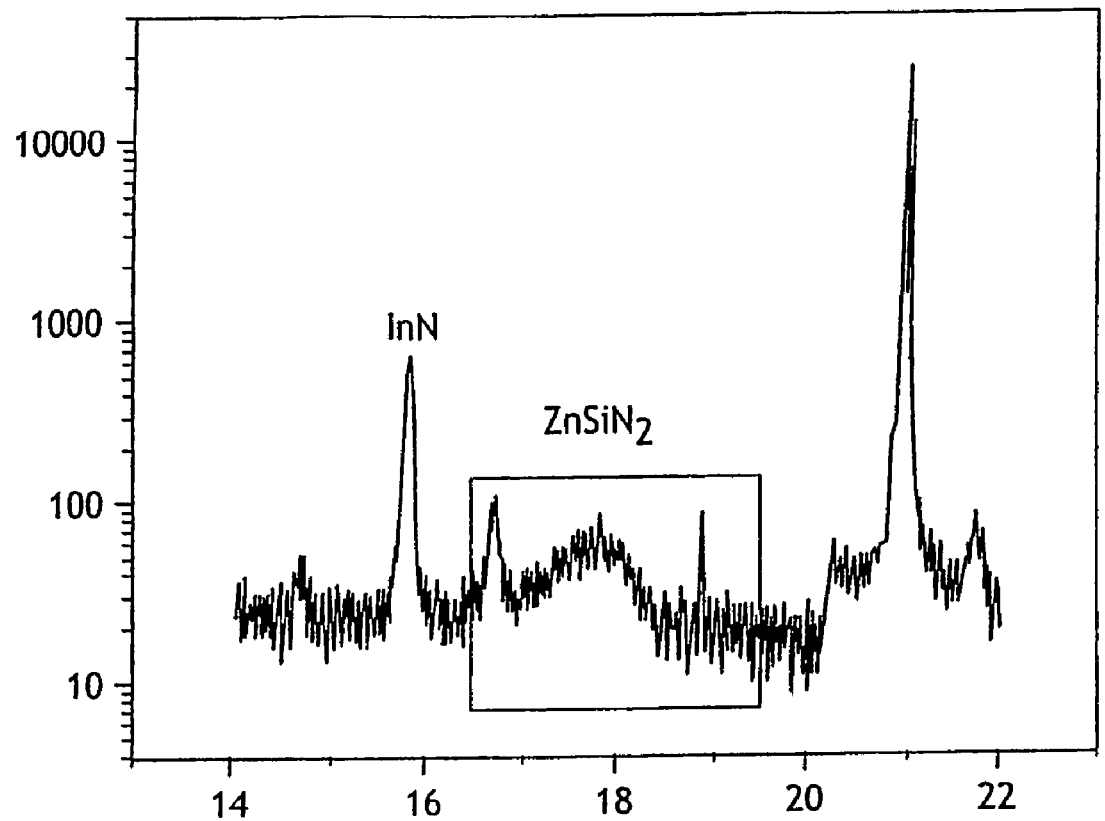
FIG. 4 shows an X-ray diffraction spectrum for an InN film grown epitaxially on a pseudosubstrate comprising a $ZnSiN_2$ film.

FIG. 4 shows an X-ray diffraction spectrum exhibiting the various peaks for an InN film grown epitaxially at about 550° C. on a pseudosubstrate 10 comprising a $ZnSiN_2$ film 2. The x-axis represents the angular deviation of the incident X-ray beam following the diffraction on the structure 20 (consisting here of the pseudosubstrate 10 and the InN film 1) and the y-axis shows the electromagnetic intensity received.

This figure shows that the peak associated with the InN film is narrow (about 400 arc sec) and narrower than the diffraction peak of the pseudosubstrate. This demonstrates in particular that the small lattice mismatch between the pseudosubstrate and InN is conducive to high-quality epitaxy. It should be noted that the line corresponding to the $ZnSiN_2$ is much broader than that corresponding to the InN, in particular because of its lower crystalline quality.

The width of the diffracted X-ray line corresponding to the InN film produced according to the invention is 2 to 3 times narrower than the lines in the prior art.

This demonstrates that the properties, especially the electronic properties, of the InN film 1 produced according to the invention are considerably improved over the properties of InN films of the prior art.

Furthermore, according to the invention, the InN film 1 and/or the II-IV-$N_2$ film 2 may be appropriately doped so as to achieve the desired electronic properties. For example, the InN film 1 may be doped with silicon and the II-IV-$N_2$ film 2 may be doped with gallium.

The invention claimed is:

1. A structure for an application in electronics, optics or optoelectronics, comprising a film (2) made of an alloy of at least one atomic element of Group II of the Periodic Table and at least one atomic element of Group IV of the Periodic Table and of $N_2$ (this alloy then being denoted by II-IV-$N_2$), characterized in that said structure further includes a film (1) of InN, and in that said film (2) of II-IV-N$_2$ alloy functions as a buffer layer and has a thickness between 0.1 microns and 5.0 microns.

2. The structure as claimed in claim 1, characterized in that the film (1) of InN is on the film (2) of II-IV-N$_2$ alloy.

3. The structure as claimed in claim 1, characterized in that it further includes, beneath the II-IV-N$_2$ alloy, a support structure (3, 3*b*) made of AlN, GaN, SiC or Si.

4. The structure as claimed in claim 3, characterized in that it further includes, beneath the support structure (3*b*), a crystalline support substrate (3*a*).

5. The structure as claimed in claim 1, characterized in that the formula of the II-IV-N$_2$ alloy is chosen from the following possible combinations: (Mg,Ca,Zn,Cd)—(C,Si,Ge,Sn,Pb)—N$_2$.

6. The structure as claimed in claim 1, characterized in that the II-IV-N$_2$ alloy and/or the InN alloy further includes at least one doping element.

7. A process for producing an atomic indium nitride film, characterized in that it includes a crystal growth step in which an InN film (1) is grown on a film (2) made of an alloy of at least one atomic element of Group II and at least one element of Group IV and of N$_2$ (this alloy then being denoted by II-IV-N$_2$), said film (2) of II-IV-N$_2$ alloy functioning as a buffer layer and having a thickness between 0.1 microns and 5.0 microns.

8. The process as claimed in claim 7, characterized in that the growth of InN is carried out at a temperature of about 700° C. or below, but at a temperature higher than about 400° C.

9. The process as claimed in claim 8, characterized in that it further includes a prior crystal growth step in which the film (2) of II-IV-N$_2$ alloy is grown on a support structure (3, 3*b*) made of AlN, GaN, SiC or Si.

10. The process as claimed in claim 9, characterized in that it further includes an initial crystal growth step in which the support structure (3*b*) is grown on a support substrate (3*a*) made of a crystalline material.

11. The process as claimed in claim 10, characterized in that
the crystal growth is chosen from the following techniques: MOVPE and MBE.

12. A substrate wafer (10) for the growth of an InN film, the wafer (10) including an upper film (2) made of an alloy of at least one atomic element of Group II of the Periodic Table and of at least one atomic element of Group IV of the Periodic Table and of N$_2$ (the alloy then being denoted by II-IV-N$_2$), characterized in that this upper film functions as a buffer layer and has a thickness between 0.1 microns and 5.0 microns.

13. The wafer (10) as claimed in claim 12, characterized in that the formula of the II-IV-N$_2$ alloy is chosen from the following possible combinations: (Mg,Ca,Zn,Cd)—(C,Si,Ge,Sn,Pb)—N$_2$.

14. The wafer (10) as claimed in claim 12, characterized in that it further includes, beneath the II-IV-N$_2$ alloy, a support structure (3, 3*b*) made of AlN, GaN, SiC or Si.

15. The wafer (10) as claimed in claim 14, characterized in that it further includes, beneath the support structure (3*b*), a crystalline support substrate (3*a*).

16. A process for producing an indium nitride film, comprising a crystal growth step in wherein the indium nitride is grown on a wafer (10) as substrate, wherein an upper part of the wafer comprises an alloy of at least one atomic element of Group II of the Periodic Table and at least one element of Group IV of the Periodic Table and of N$_2$ (the alloy then being denoted by II-IV-N$_2$), said of II-IV-N$_2$ alloy functioning as a buffer layer and having a thickness between 0.1 microns and 5.0 microns.

17. The process as claimed in claim 7, characterized in that the growth of InN is carried out at a temperature between about 400° C. and about 650° C.

* * * * *